(12) United States Patent
Bohr et al.

(10) Patent No.: US 6,337,507 B1
(45) Date of Patent: *Jan. 8, 2002

(54) SILICIDE AGGLOMERATION FUSE DEVICE WITH NOTCHES TO ENHANCE PROGRAMMABILITY

(75) Inventors: Mark T. Bohr, Aloha; Mohsen Alavi, Beaverton; Min-Chun Tsai, Portland, all of OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/769,152
(22) Filed: Dec. 18, 1996

Related U.S. Application Data

(63) Continuation-in-part of application No. 08/537,283, filed on Sep. 29, 1995, now Pat. No. 5,708,291.

(51) Int. Cl.[7] .............................................. H01L 29/00
(52) U.S. Cl. ..................................... 257/529; 438/132
(58) Field of Search ........................... 257/529; 438/132, 438/281, 333, 601

(56) References Cited

U.S. PATENT DOCUMENTS

| | | | | |
|---|---|---|---|---|
| 4,042,950 A | * | 8/1977 | Price | 257/529 |
| 4,267,633 A | * | 5/1981 | Seiler | 257/529 |
| 4,356,622 A | * | 11/1982 | Widmann | 257/755 |
| 4,413,272 A | * | 11/1983 | Mochizuki et al. | 257/529 |
| 4,494,135 A | | 1/1985 | Moussie | |
| 4,518,981 A | * | 5/1985 | Schlupp | 257/529 |
| 4,569,121 A | * | 2/1986 | Lim et al. | 257/530 |
| 4,628,590 A | * | 12/1986 | Udo et al. | 257/529 |
| 4,635,091 A | * | 1/1987 | Roger | 257/529 |
| 4,723,155 A | * | 2/1988 | Uchida | 257/529 |
| 4,747,076 A | * | 5/1988 | Mukai | 257/529 |
| 4,748,491 A | * | 5/1988 | Takagi | 257/529 |
| 4,796,075 A | * | 1/1989 | Whitten | 257/529 |
| 5,066,998 A | | 11/1991 | Fischer et al. | |
| 5,309,394 A | * | 5/1994 | Wuertz et al. | 257/529 |
| 5,672,905 A | * | 9/1997 | Lee et al. | 257/529 |
| 5,854,510 A | * | 12/1998 | Sur, Jr. et al. | 257/529 |
| 5,882,998 A | * | 3/1999 | Sur, Jr. et al. | 438/601 |
| 5,976,943 A | * | 11/1999 | Manley et al. | 438/382 |

FOREIGN PATENT DOCUMENTS

| | | | | |
|---|---|---|---|---|
| EP | 0241046 | * | 10/1987 | 257/529 |
| JP | 1-169942 | * | 7/1989 | 257/529 |
| WO | WO 96/22622 | | 7/1996 | |

OTHER PUBLICATIONS

"Polysilicon Fuse Structure", *IBM Technical Disclosure Bulletin*, vol. 29, No. 1, (Jun. 1986) pp 144–145.

* cited by examiner

*Primary Examiner*—Sara Crane
(74) *Attorney, Agent, or Firm*—Cynthia T. Faatz

(57) ABSTRACT

A fusible link device disposed on a semiconductor substrate for providing discretionary changes in resistance. The fusible link device of the invention includes a polysilicon layer having a first resistance. A silicide layer formed on the polysilicon layer has a second, lower resistance and includes a fuse region having a first notched region narrower than the center of the fuse region, a first contact region electrically coupled to one end of the fuse region and a second contact region electrically coupled to an opposite end of the fuse region. The silicide layer agglomerates to form an electrical discontinuity in the fuse region (usually in the notched region) in response to a current greater than or equal to a predetermined programming current flowing between the contact regions, such that the resistance of the fusible link device can be selectively increased.

3 Claims, 8 Drawing Sheets

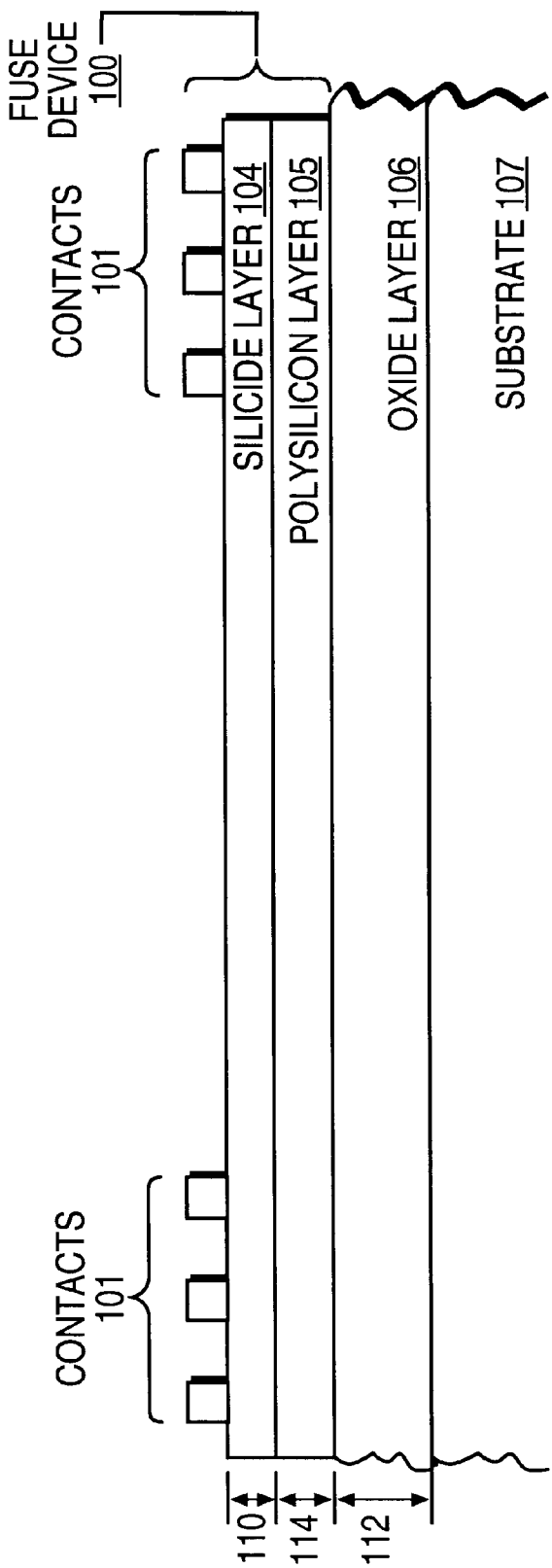
FIG. 1A (SIDE VIEW)

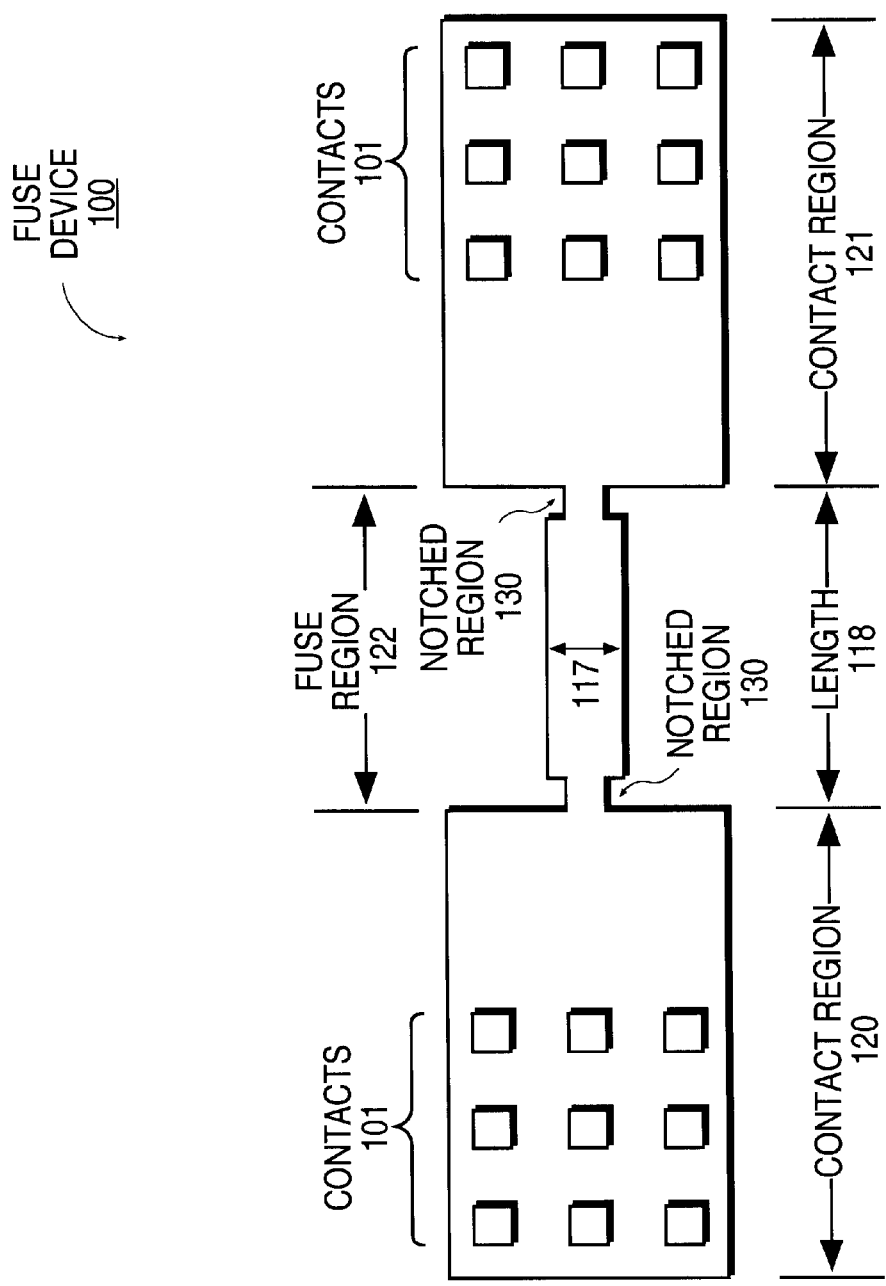
FIG. 1B (TOP VIEW)

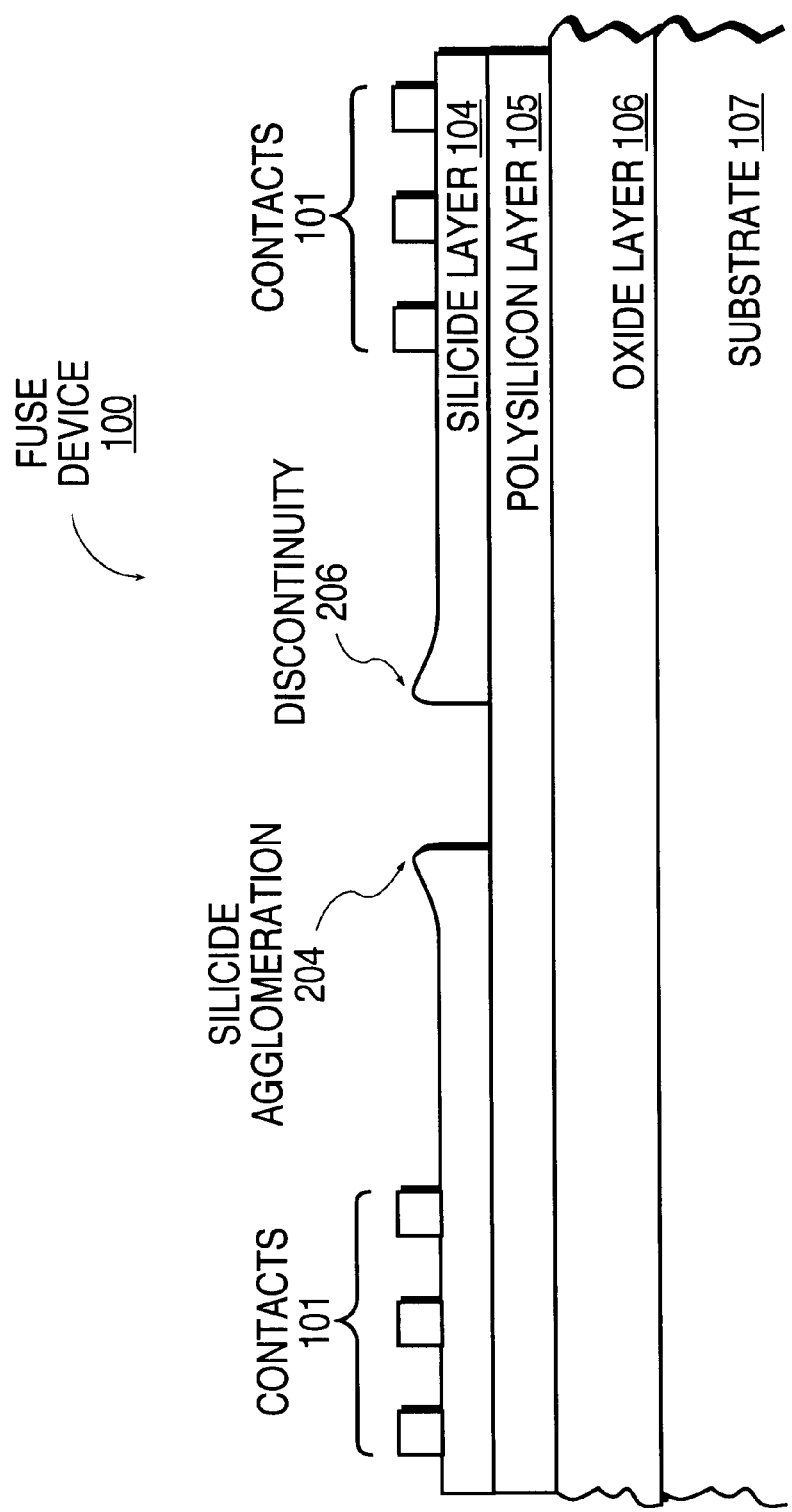
FIG. 2A (PROGRAMMED FUSE)

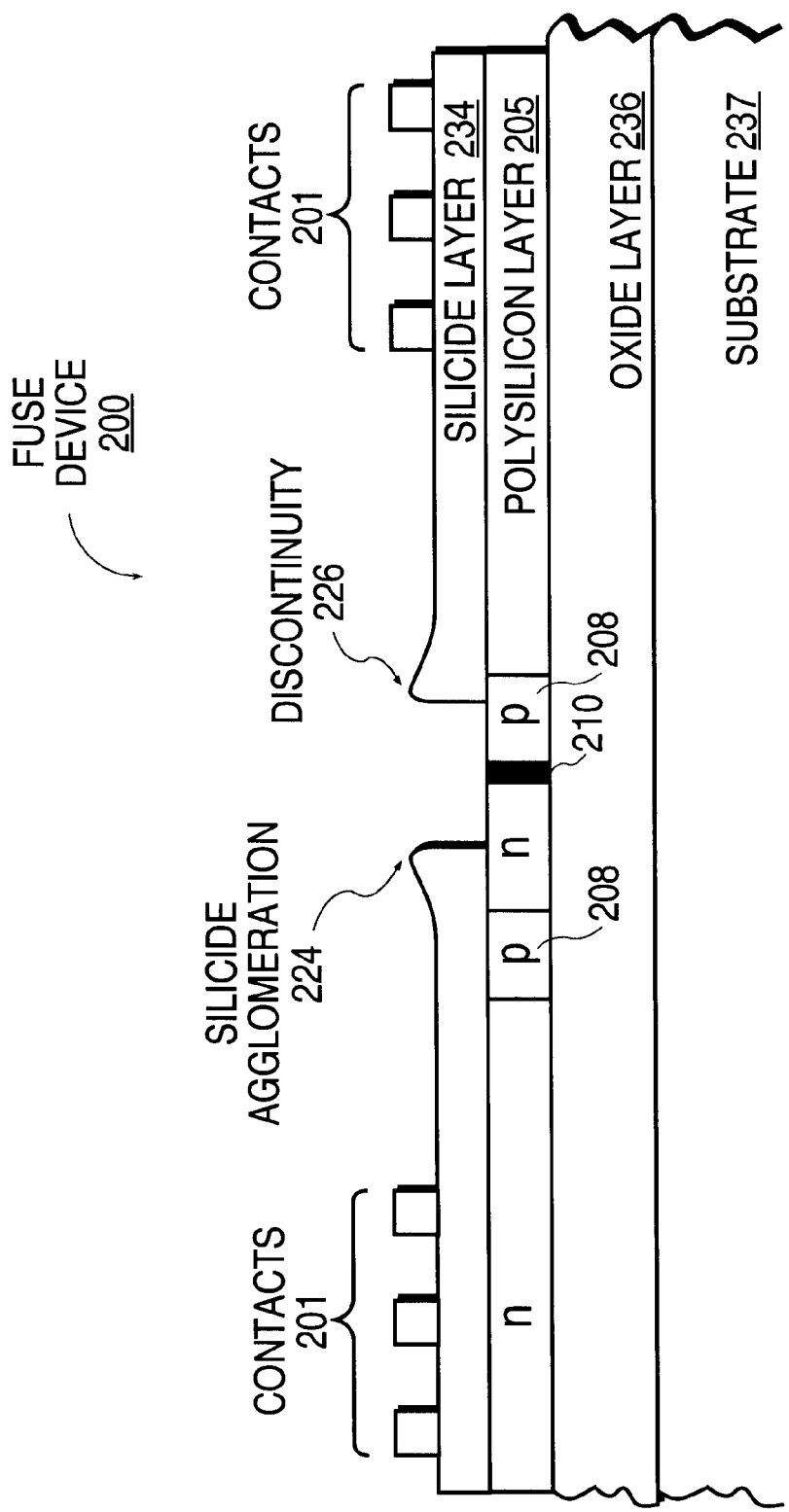
FIG. 2B (PROGRAMMED FUSE)

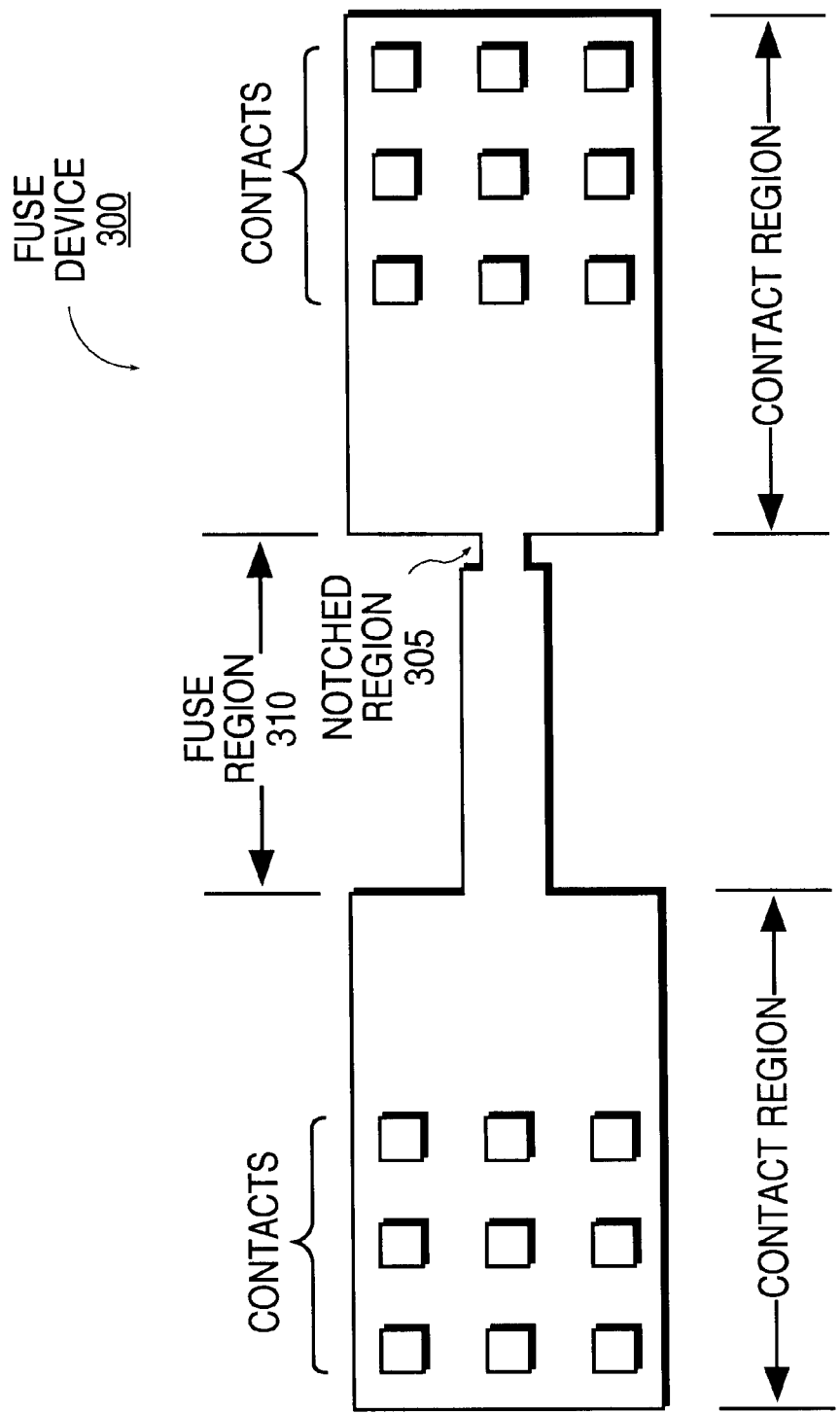

SILICIDE AGGLOMERATION FUSE DEVICE WITH NOTCHES TO ENHANCE PROGRAMMABILITY

RELATED APPLICATIONS

This application is a continuation-in-part of U.S. patent application Ser. No. 08/537,283 entitled, "A Silicide Agglomeration Fuse Device," filed Sep. 29, 1995, now U.S. Pat. No. 5,708,291.

FIELD OF THE INVENTION

The invention relates to the field of integrated circuit devices and more particularly, to fusible link devices in semiconductor integrated circuits.

BACKGROUND OF THE INVENTION

In integrated circuits including CMOS integrated circuits, it is often desirable to be able to permanently store information, or to form permanent connections on the integrated circuit after it is manufactured. Fuses or devices forming fusible links are frequently used for this purpose. Fuses can be used to program redundant elements to replace identical defective elements, for example. Fuses can also be used to store die identification or other such information, or to adjust the speed of a circuit by adjusting the resistance of the current path.

In some cases, electrically erasable programmable read only memory (EEPROM) devices are used to perform the discretionary connection function of a fuse device. Semiconductor process technologies continue to provide for smaller device geometries and operate at lower voltages. As the device geometries are reduced, so is the thickness of the gate oxide layer. EEPROM memory devices require a minimum gate oxide thickness to prevent high leakage currents and sustain a charge on the floating node. Thus, EEPROM memory devices are not viable for use on many of the latest semiconductor process technologies.

Other fuse devices require an extra semiconductor processing step to form or program the discretionary connections. For example, one type of fuse device is "programmed" using a laser to open a link after the semiconductor device is processed. This type of fuse device not only requires an extra processing step to program or "blow" the fuse devices where desired, but also requires precise alignment of the laser on the fuse device to avoid destroying neighboring devices. This and other similar approaches can result in damage to the device passivation layer, and thus, lead to reliability concerns. In some approaches, the passivation layer must actually be removed before programming the fuse device to provide space for the fuse material when the connection is destroyed. In other approaches, where the passivation layer is not intentionally removed, the process of blowing the fuse can cause a hole in the passivation layer when the fuse material is displaced.

Another type of memory device, referred to as an "oxide antifuse" device, is programmed using high voltages compared to the circuit's normal operating voltage supply. Therefore, the peripheral circuitry for these devices generally requires higher junction breakdown voltages than those normally available on the integrated circuit. This is an issue for newer process technologies and those in development for the same reasons described above in reference to EEPROM memory devices. The reduced gate oxide thicknesses require higher well doping which results in lower junction breakdown voltages, and thus, oxide antifuse devices may also not be viable for use with many of the latest process technologies.

The invention provides a small fuse device which can be manufactured without additional processing steps, and which can be reliably used with lower voltage, thinner gate oxide process technologies in use today and in development for the future. Further, the fuse device of the invention can be programmed using relatively low voltages without damage to overlying dielectric layers.

SUMMARY OF THE INVENTION

A fusible link device disposed on a semiconductor substrate for providing discretionary changes in resistance is described. The fusible link device of the invention includes a polysilicon layer having a first resistance and a silicide layer formed on the polysilicon layer having a second, lower resistance. The silicide layer includes a fuse region having a first notched region narrower than the center of the fuse region, a first contact region coupled to one end of the fuse region, and a second contact region coupled to an opposite end of the fuse region. The silicide layer is agglomerable to form an electrical discontinuity in the fuse region in response to a first current greater than or equal to a predetermined programming current flowing through the fuse such that the resistance of the fusible link device can be selectively increased.

BRIEF DESCRIPTION OF THE DRAWINGS

The invention will be understood more fully from the detailed description given below and from the accompanying drawings of embodiments of the invention, which, however, should not be taken to limit the invention to the specific embodiments, but are for explanation and understanding only.

FIG. 1A illustrates a side view of the fusible link device of one embodiment of the invention.

FIG. 1B illustrates a top view of the fusible link device of one embodiment of the invention.

FIG. 2A illustrates a side view of the fusible link device of one embodiment of the invention after programming.

FIG. 2B illustrates a side view of the fusible link device of an alternate embodiment of the invention after programming.

FIG. 3 illustrates a top view of a fusible link device of an alternate embodiment of the invention having a notched region at one end of the fuse region.

FIG. 7 is a side view of the fusible link device of one embodiment.

DETAILED DESCRIPTION

Figure 4:
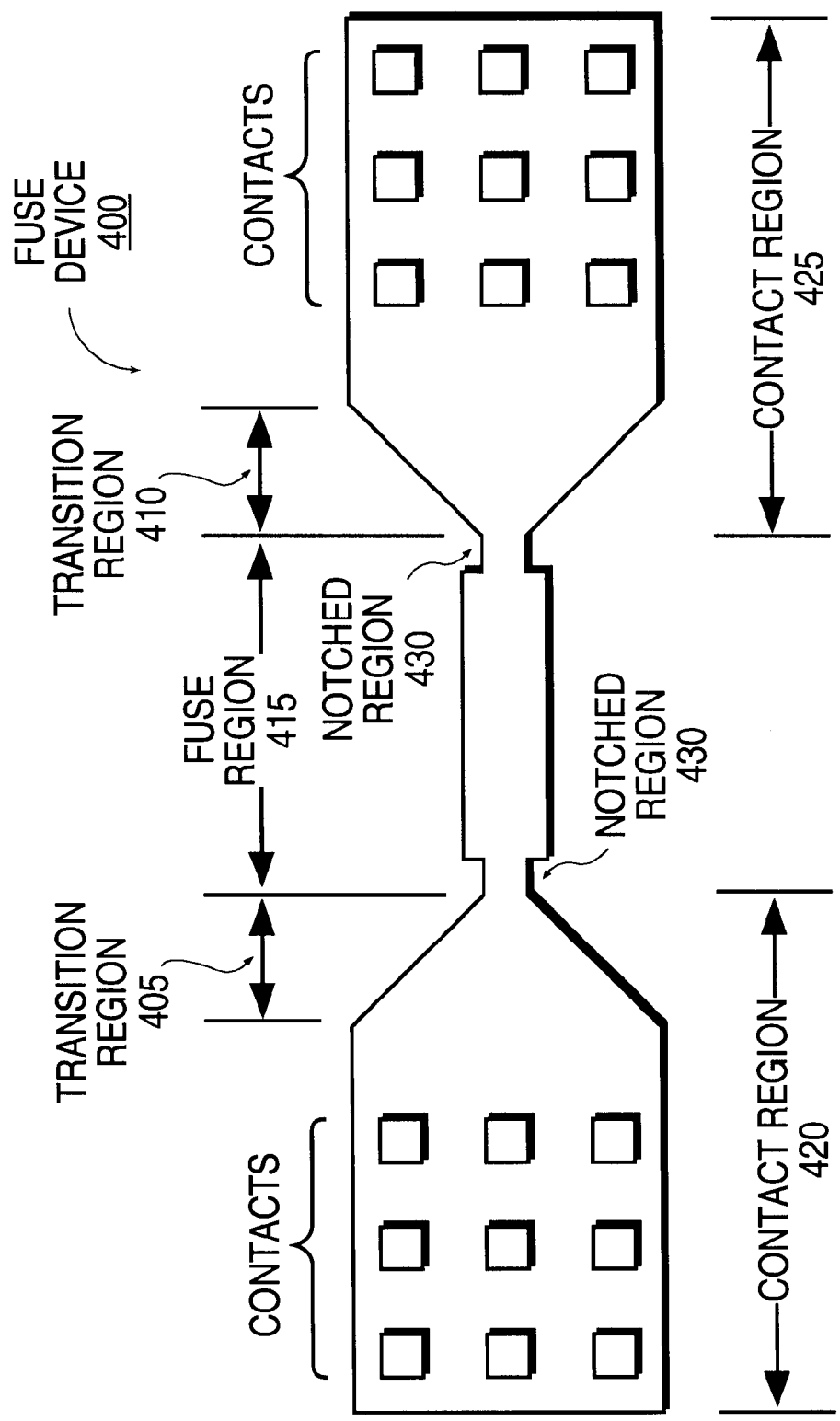
FIG. 4 illustrates a top view of a fusible link device of another alternate embodiment of the invention having tapered transition regions and notched regions at either end of the fuse region.

A silicide agglomeration fuse device for providing discretionary changes in resistance is disclosed. In the following description, numerous specific details are set forth, such as particular materials, dimensions, numbers of contacts, programming voltages and currents, in order to provide a thorough understanding of the invention. However, it will be appreciated by one of ordinary skill in the art that the invention may be practiced without these specific details. In other instances, well-known structures, and circuits have not been described in detail in order to avoid obscuring the invention.

The fuse device of the invention includes a silicide layer formed on a polysilicon layer on a semiconductor substrate, wherein the polysilicon layer has a first resistance. The silicide layer has a second, lower resistance (the unprogrammed resistance of the fuse device) and includes a fuse region, a first contact region coupled to one end of the fuse region and a second contact region coupled to an opposite end of the fuse region. A current which is greater than or equal to a predetermined programming current flowing through the fuse causes the silicide layer to agglomerate and create an electrical discontinuity in the fuse region such that the fuse has a significantly higher programmed resistance. Various embodiments of the fuse device of the invention are described below in reference to FIGS. 1–6.

FIG. 1A illustrates a side view of one embodiment of the silicide agglomeration fuse device 100 of the invention which is alternately referred to herein simply as a fuse. The fuse device 100 is disposed on a semiconductor substrate 107 which may be part of a larger integrated circuit device. The semiconductor substrate 107 may include various layers including active and or passive devices, metal layers, dielectric layers and other materials used in the manufacture of integrated circuits. An oxide layer 106, has a thickness 112 of about 3000–4000 Å, and is formed between the fuse device 100 and the substrate 107. The fuse device 100 includes a polysilicon layer 105 which is formed on the oxide layer 106 and a silicide layer 104 formed on the polysilicon layer 105. In one embodiment, the silicide layer 104 and the polysilicon layer 105 of the fuse device 100 are formed by the same processing steps used to produce the polysilicon and silicide gate layers of other devices on an integrated circuit device. In this manner, no additional processing steps are required to manufacture the fuse device 100 when the fuse device is embodied on an integrated circuit.

The polysilicon layer 105 has a thickness 114 of about 2500 Å. In one embodiment, the polysilicon layer 105 is doped p-type, however other embodiments may include other types of doping including n-type, as well as the formation of p-n junctions in the polysilicon layer 105 as described below in more detail in reference to FIG. 2B, or the polysilicon layer 105 may be undoped. The sheet resistance of the polysilicon layer 105 is greater than 500 ohm/sq.— about 1000 ohm/sq. in one embodiment.

The silicide layer 104 is a nickel silicide ($NiSi_2$) film, although other silicides, such as tungsten, titanium, tantalum or platinum silicides, may also be used in accordance with the invention. The silicide layer 104, has a thickness 110 of about 225–250 Å. The sheet resistance of the silicide layer 104 depends on its exact composition, but is about 1–10 ohm/sq.

The fuse device 100 also includes contacts 101 at either end of the fuse device 100 which are substantially square in shape, but may be rectangular, round or another shape in alternate embodiments. Multiple contacts 101 operating in parallel may be used to ensure that the required programming current flows through the fuse device 100 without overheating the contacts 101. The contacts 101 are formed on and electrically coupled to the silicide layer 104 to provide an electrical connection between the fuse device and an external device or other components in the same integrated circuit. In one embodiment, the contacts 101 are coupled to metal interconnect lines (not shown) such that the fuse device 100 may be accessed for programming, sensing or other uses. The contacts 101 are tungsten plugs in one embodiment, but may be formed of other materials. In alternate embodiments, metal interconnect lines of the integrated circuit in which the fuse device 100 is formed are coupled directly to the silicide layer 104 to provide the same functionality.

FIG. 1B illustrates a top view of one embodiment of the fuse device 100. The fuse device 100 includes a fuse region 122, also referred to herein as a fuse element. A first contact region 120 is electrically coupled to one end of the fuse region 122 and a second contact region 121 is electrically coupled to an opposite end of the fuse region 122. The contacts 101 are formed in the contact regions 120 and 121 on the fuse device 100.

The size of the fuse region 122 can vary with different processing technologies, space considerations, and other fuse requirements. In one embodiment, the width 117 of the center of the fuse region from the top view shown in FIG. 1B is about 0.3 microns in one embodiment, and the length 118 is about seven times the width 117 of the fuse region 122, but may be larger or smaller in other embodiments.

The width 117 of the center of the fuse region 122 is maintained above a predetermined minimum width as fuse devices having very narrow fuse regions can be difficult to reliably manufacture and may result in a higher percentage of imperfect fuses. The predetermined minimum width depends on the particular process used to manufacture the fuse devices but is about 0.3 microns in one embodiment. While the center of the fuse device 100 is maintained above a predetermined minimum width, notched regions 130 are provided at either end of the fuse region 122 where the silicide layer typically agglomerates in response to a programming current flowing between the contact regions 120 and 121. The manner in which the silicide layer agglomerates is described in more detail below. The notched regions 130 are narrower than the width 117 of the center of the fuse region, about 0.24 microns in one embodiment, such that the silicide layer 104 agglomerates more easily in either of the notched regions 130 to provide for ease of programming. In this manner, the programming voltage of the fuse device 100 is low, about 2 volts in one embodiment, while maintaining the manufacturability of the fuse device in order to achieve a high yield. The notched regions 130 are provided at either end of the fuse region 122 in this embodiment such that the fuse can be programmed with an equally low programming voltage regardless of the direction of current flow through the fuse device 100 during programming.

The contact regions 120 and 121 are rectangular in shape in one embodiment and transition abruptly at approximately a 90 degree angle to the fuse region 122. In this manner, a large thermal gradient is provided during programming to further contribute to ease of programming. In one embodiment, the contact regions 120 and 121 are 5 micron by 5 micron squares. The size of these areas modulates the thermal gradient during fusing such that fuses with smaller contact areas have reduced programming success. The number of contacts 101 on the fuse device 100 may vary. Although nine contacts 101 are shown at either end of the fuse device 100 in FIG. 1B, a larger or smaller number of contacts may also be used in accordance with the invention.

In operation, the fuse device 100 has a first resistance before it is programmed or "blown," and a significantly higher second resistance after is programming. Before the fuse device 100 is programmed, its resistance is determined by the resistance of the silicide layer 104. During programming, a discontinuity is formed in the silicide layer 104 such that current must flow through the underlying polysilicon layer. The resistance of the fuse device thus increases significantly with the amount of the increase being determined by the ratio of the resistance of the polysilicon layer 105 to that of the silicide layer 104.

The effects of programming the fuse device 100 are described in more detail in reference to FIGS. 2A and 2B. FIG. 2A illustrates a side view of the fuse device 100 of the invention after being programmed. A potential applied across the contact regions 120 and 121 causes current to flow from one end of the fuse device 100 to the other, through the silicide film layer 104. The current causes the silicide layer 104 to heat up, and, if the current is greater than or equal to a predetermined minimum programming current, causes the silicide itself to agglomerate as indicated by silicide agglomeration region 204. A discontinuity 206 is thus formed in the silicide layer 104 capping the polysilicon layer 105. Although the discontinuity 206 is illustrated in FIG. 2A and also in FIG. 2B below as being located midway between the contact regions including the contacts 101, it will be appreciated by those of skill in the art that the discontinuity 206 (and 226 in FIG. 2B) usually occurs in silicide layer 104 at the notched region 130 (shown in FIG. 1B).

Because the silicide layer 104 has a much lower resistance than the polysilicon layer 105, the resistance of the fuse device 100 increases accordingly. Using the sample sheet resistances provided above (1–10 ohms/sq for the silicide layer 104 and >500 ohms/sq for the polysilicon layer), the resistance of the fuse device increases at least ten times after programming. In some embodiments, such as the embodiment described with reference to FIG. 2B, the increase in resistance is much greater. This change in resistance is then detected by a sensing circuit to determine whether the fuse device 100 has been programmed. A programming circuit which may be used to program the fuse device of the invention, and a sensing circuit which may be used to sense the state of the fuse device of the invention are described in copending U.S. patent application, Ser. No. 08/580,839, entitled, "A Static, Low Current, Low Voltage Sensing Circuit for Sensing the State of a Fuse Device," filed Dec. 29,1995.

FIG. 2B illustrates a side view of a programmed fuse device 200 in accordance with another embodiment of the invention. The fuse device 200 includes contacts 201, a silicide layer 234, an oxide layer 236 and a substrate 237 which are similar in composition, placement and functionality to identically named components of the fuse device 100 described above. The polysilicon layer 205 of the fuse device 200, however, differs from the polysilicon layer 105 of the fuse device 100. The polysilicon layer 205 of the fuse device 200 is doped n-type and includes one or more regions 208 which are doped p-type. The regions 208 which are doped p-type form p-n junctions, such as p-n junction 210, with the n-type regions of the polysilicon layer.

The fuse device 200 is programmed in the same manner as the fuse device 100 using a low programming voltage and current. Programming the fuse causes the silicide layer 234 to agglomerate (as illustrated by silicide agglomeration 224) to form a discontinuity 226. If the discontinuity 226 is formed over a p-n junction such as the p-n junction 210, current flow between the contacts 201 is diverted from the silicide layer 234 at the discontinuity 226, through the polysilicon layer 205, and in this case, through the p-n junction 210. In this manner, the ratio of the resistance of the programmed fuse 200 to an unprogrammed fuse identical to fuse 200, is significantly increased in the case where the discontinuity 226 is formed over a p-n junction 210 during programming. Although the p-n junction 210 is illustrated in FIG. 2B as being located about halfway between the contacts 201, it will be appreciated by those of skill in the art that the p-n junction 210 may be located anywhere in the polysilicon layer 205.

The programming current, and thus, the voltage required to program the fuse device 100 is relatively low as indicated above. It is to be understood that the fuse device 100 is referred to herein for purposes of illustration. Other similar fuse devices, such as the fuse device 200 are programmed, sensed, and operate in a similar manner. In one embodiment, the fuse device 100 may be blown using a programming current of about 10 mA corresponding to a potential difference of about 2.0 volts across the fuse device during programming. Other embodiments have lo different programming currents which depend on the thickness of the silicide layer and other geometries of the fuse device 100.

FIG. 3 illustrates an alternate embodiment of the fuse device of the invention. The fuse 300 shown in FIG. 3 is similar to the fuse 100 illustrated and described in reference to FIGS. 1A, 1B and 2. The fuse device 300 of FIG. 3 includes only one notched region 305 at one end of the fuse region 310. In this manner, the fuse 300 is somewhat more easily programmed since with only one notched region, more of the thermal energy is concentrated at that notched region.

FIG. 4 illustrates another embodiment of the fuse of the invention. The fuse device 400 includes transition regions 405 and 410 between the fuse region 415 and the contact regions 420 and 425. In this embodiment, each of the transition regions 405 and 410 forms approximately a 45° angle between the respective contact region 420 or 425 and the fuse region 415. Similar to the fuse device 100 illustrated in FIG. 1B, the fuse device 400 includes notched regions 430 at either end of the fuse region 415 providing the same advantages as discussed in reference to FIG. 1B. However, under similar currents, in this embodiment, the temperature gradient at the notch is reduced due to the existence of the tapered region while the magnitude of temperature at the notched region is increased.

Figure 5:
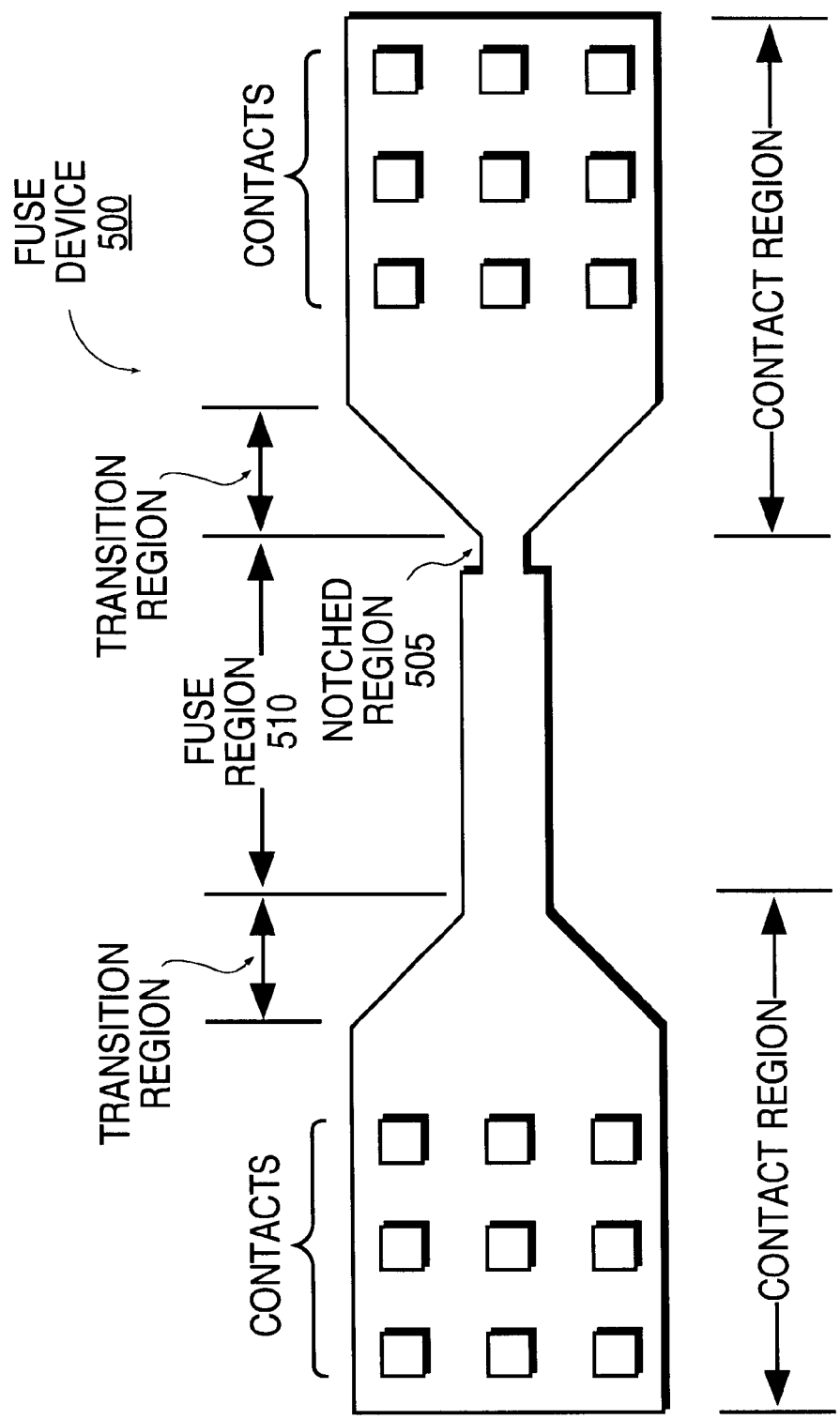
FIG. 5 illustrates a top view of a fusible link device of another alternate embodiment of the invention having tapered transition regions and a notched region at one end of the fuse region.

FIG. 5 illustrates a fuse device 500 in accordance with another embodiment of the invention. The fuse device 500 is similar to the fuse device 400 of FIG. 4 except that the fuse device 500 includes only one notched region 505 at one end of the fuse region 510. The fuse device 500 therefore has more energy concentrated at the notched region than the fuse device 400 under identical current. This is similar to the comparison made between fuse devices 300 and 200 described in reference to FIG. 3.

Although particular fuse device configurations have been described in reference to FIGS. 1–5, it will be appreciated by those of skill in the art that other configurations and variations are also within the scope of the invention. For example, in alternate embodiments, the thicknesses and other dimensions of the various layers may be larger or smaller, and regions such as the contact regions may be shaped differently than the contact regions described and illustrated in the Figures. Further, the sheet resistance of the polysilicon and silicide layers may be larger or smaller although the resistance of the silicide layer in all embodiments is significantly lower than the resistance of the polysilicon layer.

Each of the fuse embodiments described above provides several advantages over existing fuses. The low programming current and thus, voltage, of the fuse device of the invention makes it ideal for use in integrated circuit devices manufactured on the latest process technologies having thin gate oxides, and thus, low junction breakdown voltages. The fuse device of the invention provides the additional advantage of being small and thus, inexpensive in terms of silicon space. Further, the formation of fuse devices in accordance with the invention, does not require additional processing steps. The fuse device of the invention may be formed using standard processing steps already performed to create other features of an integrated circuit device on which the silicide agglomeration fuse device is embodied contributing to a low cost of manufacturing.

In addition to being inexpensive to implement and viable for use on low voltage process technologies, the silicide agglomeration fuse device of the invention can be programmed without damaging overlying dielectric layers. Further, the fuse device of the invention does not have to be exposed to the air to be programmed, and the programming step itself does not create holes in the passivation or other layers surrounding the fuse device as with some prior art fuse devices.

Figure 6:
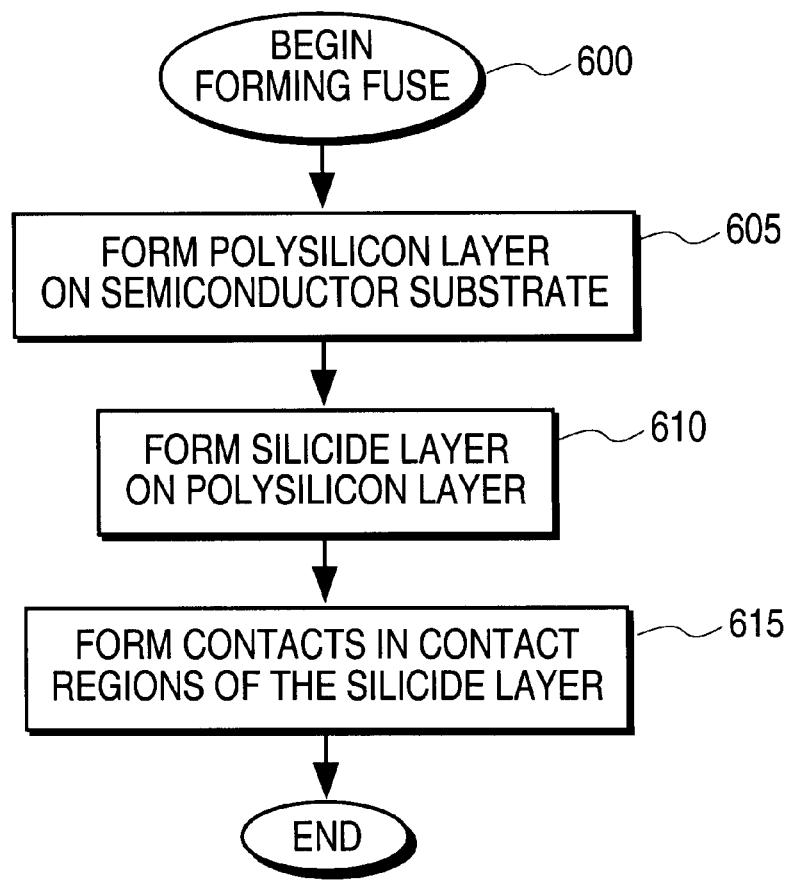
FIG. 6 is a flow diagram illustrating the fusible link formation method of one embodiment of the invention.

One embodiment of the method of the invention is described in reference to FIG. 6 and begins at step 600. In step 605, a polysilicon layer is formed on a semiconductor substrate. In step 610, a silicide layer is formed on the polysilicon layer. The silicide layer of the invention includes a fuse region, and a contact region coupled to either end of the fuse region. In step 615, contacts are formed in the contact regions of the silicide layer. Step 615 is optional as electrical connections can be made directly to the contact regions of the fuse device of the invention without the presence of contacts. The fuse formation method of the invention ends at step 620.

Thus a silicide agglomeration fuse device and method for forming a silicide agglomeration fuse device are described. Whereas many alterations and modifications of the invention may occur to one of ordinary skill in the art after having read the foregoing description, it is to be understood that the particular embodiments shown and described by way of illustration are in no way intended to be considered limiting. Therefore, references to details of various embodiments are not intended to limit the scope of the claims which in themselves recite only those features regarded as the invention.

We claim:

1. A fusible link device disposed on a semiconductor substrate, the fusible link device for providing discretionary changes in resistance, the fusible link device comprising:

a semiconductor layer having a first resistance and a first thickness; and a silicide layer formed on the semiconductor layer, the silicide layer including a fuse region having a first notched region, the first notched region being narrower than at least part of the fuse region, the silicide layer having a second thickness smaller than the first thickness and a second resistance lower than the first resistance, wherein the first thickness and the second thickness are selected to cause the silicide layer to be agglomerable to form an electrical discontinuity in the fuse region in response to a first current greater than or equal to a predetermined programming current flowing through the silicide layer, wherein the semiconductor layer includes at least one p-n junction in the semiconductor layer.

2. A fuse disposed on a semiconductor substrate, and having a first unprogrammed resistance, the fuse comprising:

a polysilicon layer having a first thickness and a first resistance; and a silicide layer formed on the polysilicon layer, the silicide layer including a fuse region having a first notched region, the first notched region being narrower than at least part of the fuse region, the silicide layer having a second thickness smaller than the first thickness and a second resistance lower than the first resistance, wherein the first and second thicknesses are selected to cause the silicide layer to be agglomerable to form an electrical discontinuity in the fuse region in response to a first current greater than or equal to a predetermined minimum programming current flowing through the silicide layer, wherein the polysilicon layer includes at least one p-n junction in the polysilicon layer.

3. A method for forming a fuse comprising:

forming a semiconductor layer of a first thickness on a substrate;

forming a silicide layer of a second smaller thickness on the semiconductor layer, the silicide layer including a fuse region having a first notched region, the notched region being narrower than at least part of the fuse region, the first and second thicknesses being selected such that the silicide layer is agglomerable to form a discontinuity in the silicide layer in response to a current greater than or equal to a predetermined programming current flowing through the silicide layer; and forming at least one p-n junction in the semiconductor layer.

* * * * *